(12) United States Patent
Gough et al.

(10) Patent No.: US 6,693,799 B2
(45) Date of Patent: Feb. 17, 2004

(54) CIRCUIT BOARD MOUNT

(75) Inventors: Gerald Ronald Gough, Houghton Regis (GB); James Robert Kitchen, Tadley (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/050,359

(22) Filed: Jan. 16, 2002

(65) Prior Publication Data

US 2002/0093798 A1 Jul. 18, 2002

(30) Foreign Application Priority Data

Jan. 17, 2001 (GB) .............................................. 0101210

(51) Int. Cl.[7] .............................................. H05K 7/12
(52) U.S. Cl. ........................ 361/758; 361/727; 361/742; 361/759; 361/801; 361/804; 361/807; 174/138 G
(58) Field of Search ................................ 361/726, 727, 361/742, 753, 758, 759, 801, 804, 807–810; 174/138 G (56) References Cited

U.S. PATENT DOCUMENTS

| 4,470,178 A | * | 9/1984 | Matsui ........................ 24/289 |
| 4,938,703 A | * | 7/1990 | Nakano ........................ 439/74 |
| 5,117,330 A | * | 5/1992 | Miazga ........................ 361/760 |
| 5,452,184 A | * | 9/1995 | Scholder et al. ............ 361/799 |
| 5,457,608 A | | 10/1995 | Scholder et al. |
| 5,490,038 A | | 2/1996 | Scholder et al. |
| 5,499,163 A | | 3/1996 | Sonntag et al. |
| 5,587,877 A | | 12/1996 | Ryan et al. |
| 5,724,231 A | | 3/1998 | Winick et al. |
| 5,963,432 A | * | 10/1999 | Crowley ...................... 361/804 |
| 6,055,152 A | | 4/2000 | Felcman et al. |
| 6,101,097 A | | 8/2000 | Foo et al. |
| 6,272,007 B1 | | 8/2001 | Kitlas et al. |

FOREIGN PATENT DOCUMENTS

GB 2157083 10/1985

OTHER PUBLICATIONS

International Search Report application No. PCT/GB02/00049 mailed Apr. 16, 2002.
International Search Report application No. GB0101210.3, mailed Apr. 22, 2002.

* cited by examiner

Primary Examiner—Jayprakash N. Gandhi
(74) Attorney, Agent, or Firm—Meyertons Hood Kivlin Kowert & Goetzel, P.C.; B. Noël Kivlin (57) ABSTRACT

A circuit board mount is provided for mounting a circuit board in an electronic equipment housing. The mount is mountable on a surface within the housing and includes a slot for receiving and supporting the circuit board at a first height with respect to the housing surface. The mount further comprises at least one upstand of a second height higher than that of the circuit board, whereby a component can be supported on the upstand without contacting the circuit board. The mount is thus able to support the circuit board and to protect the circuit board during handling of other components within the housing.

22 Claims, 9 Drawing Sheets

CIRCUIT BOARD MOUNT

BACKGROUND OF THE INVENTION

This invention relates to mounts for circuit boards.

With a trend toward packing components in compact electronic equipment, there is often little space between components. A circuit board, for example a motherboard, requires support in order to avoid strain being placed on the board. Moreover, in electronic equipment where it is desired to allow components to be replaced in the event of a fault in a component, the space to permit the removal of a bulky component and the replacement of that component can be limited.

The present invention seeks to provide a mount for a circuit board that can support the circuit board and provide protection for the circuit board.

SUMMARY OF THE INVENTION

A first aspect of the invention provides a circuit board mount for mounting a circuit board in an electronic equipment housing. The mount is mountable on a surface within the housing and includes a slot for receiving the circuit board and for supporting the circuit board at a first height with respect to the housing surface. The mount further comprises at least one upstanding portion (hereinafter referred to as an upstand) of a second height higher than that of the circuit board, whereby a component can be supported on the upstand without contacting the circuit board.

The mount is thus able to support the circuit board and to protect the circuit board during handling of other components within the housing.

In one embodiment the mount has a slot shaped aperture for receiving a fastening (e.g., a screw), whereby the mount is slideably mountable on the housing surface.

A lower surface of the mount can have at least one ridge for engagement with a linear depression in the housing surface to facilitate linear sliding of the mount with respect to the housing surface. Alternatively, a lower surface of the mount can have at least one linear depression for engagement with a ridge in the housing surface to facilitate linear sliding of the mount with respect to the housing surface.

In one example of the invention, the circuit board mount has two upstands, one either side of the mount.

The circuit board mount can be made of insulating plastics material.

Another aspect of the invention provides electronic equipment including a housing, a circuit board and a circuit board mount as defined above. In one embodiment, the circuit board is a motherboard. The electronic equipment can further include a component that can be supported on the upstand during introduction or removal of the component from the housing. The component can be a power supply, with the electronic equipment being a computer server.

A further aspect of the invention provides a method of supporting a circuit board in an electronic equipment housing. The method comprises mounting a circuit board mount on a surface within the housing, the mount being slideable towards the circuit board and including a slot for receiving and supporting the circuit board at a first height with respect to the housing surface, securing the mount with the circuit board received in the slot, and subsequently using at least one upstand of the mount of a second height higher than that of the circuit board to support a component during insertion or removal of the component without the component contacting the circuit board.

Further aspects and advantages of the invention will become apparent from the following description of a particular embodiment.

BRIEF DESCRIPTION OF THE DRAWINGS

Embodiments of the present invention will be described hereinafter, by way of example only, with reference to the accompanying drawings in which like reference signs relate to like elements and in which.

DESCRIPTION OF PARTICULAR EMBODIMENTS

Embodiments of the present invention are described in the following with reference to the accompanying drawings.

Figure 1:
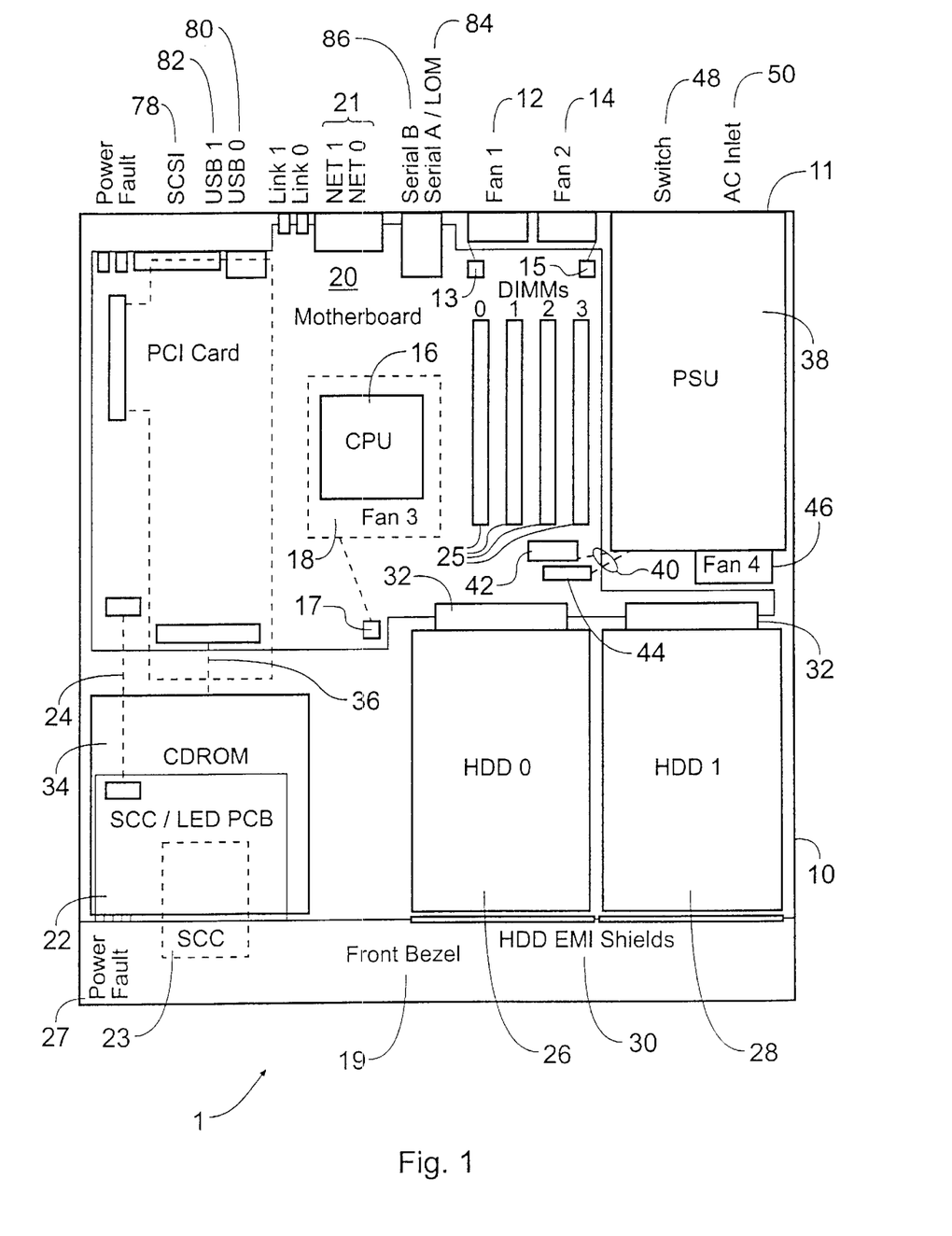
FIG. 1 is a physical plan view of a computer system that implements an embodiment of the invention.

FIG. 1 is a physical plan view of narrow form-factor computer system 1 designed for rack mounting. This computer system is compactly configured while offering high performance at reasonable cost.

The computer system 1 comprises a housing 10 with a front bezel 19 that is removable for front access to the disk drives and a System Configuration Card (SCC) 23 and reader 22. Rack mounting is supported for standard 19" racks via right-angled flanges (not shown). Slide-rail support is also provided.

The housing 10 is cooled, from front to rear, by two system fans 12, 14 mounted on a rear panel of the housing, with venting in the front and rear panels as required. The host processor (CPU) 16 also has its own dedicated local cooling comprising an impingement fan 18 that clips onto the CPU socket. These three fans plug directly into the motherboard 20 at 13, 15 and 17, respectively. The motherboard 20 is a PCB assembly, designed in a custom form-factor to fit the housing 10. The shape of the motherboard is chosen so as to minimise cabling within the housing. The motherboard 20 carries the majority of circuitry within the computer system 1.

All external interfaces are included directly on the rear edge of the motherboard, for access through the rear-panel 11 of the housing 10. The external interfaces comprise two network interfaces 21, two serial interfaces 84, 86 and a Small Computer System Interface (SCSI) interface 78. Indicators for Power, Fault and Network Link status are also positioned at the rear of the housing.

A system, or host, processor (CPU) 16 for the computer system 1 is mounted in a standard 370 pin zero insertion force (ZIF) socket on the motherboard 20. It has a passive heat sink. Dual in-line memory modules (DIMMs) are mounted in sockets 25 on the motherboard 20. A small printed circuit board (PCB) 22 is included at the front of the housing 10 to carry a System Configuration Card (SCC) 23 and LEDs 27 for Power and Fault status indication. A 10-way ribbon cable 24 connects this PCB to the motherboard 20. Two SCSI hard disk drives 26 and 28 are mountable in respective bays to the front of the motherboard 20. The drives are hot pluggable and are accessible by removal of the front bezel 19 and EMI shields 30. The two internal SCSI hard disk drives 26 and 28 plug directly into the motherboard via right-angled connectors 32 located on the front edge of the motherboard 20.

A slim (notebook-style) CDROM drive bay is provided, mounted laterally in front of the motherboard for a CDROM drive 34. Compact disks may be inserted and removed via an access slot (not shown) located on the lower left side of the front bezel 19. A connector at the rear of the CDROM bay connects the CDROM drive 34 via a ribbon cable 36 to the motherboard 20.

A Power Supply Unit (PSU) 38 is connected to the motherboard via a short harness 40 with two mating connectors 42 and 44 for power and services. The PSU 38 has its own cooling fan 46 and additionally houses the system power switch 48 and power input connector(s) 50.

Figure 2:
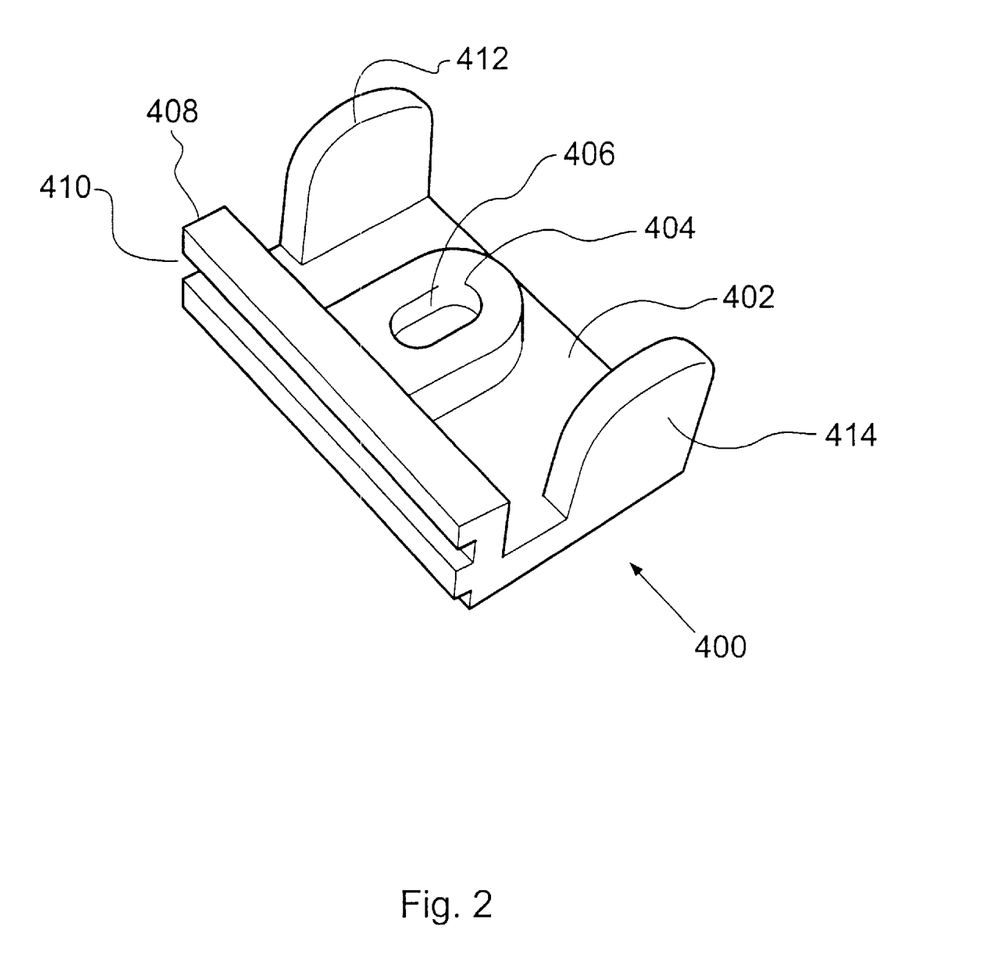
FIG. 2 is a perspective view of an embodiment of a circuit board mount in accordance with the present invention.

FIG. 2 is a perspective view of a circuit board mount 400. The circuit board mount 400 is formed of an insulating plastics material, for example PC-ABS, or nylon.

The circuit board mount 400 has a base 402 with a central upstanding boss 404. The upstanding boss 404 is provided with an elongate hole 406, which passes right through the circuit board mount 400, for receiving a fastener or fastening, for example a screw. An upstanding wall 408 is formed at a front edge of the base 402, the upstanding wall 408 being formed with a horizontal slot 410 in the front edge thereof. The slot 410 is configured to receive a circuit board for supporting the circuit board. Also shown in FIG. 2 are upstands 412 and 414 provided at either side of the base rearwardly of the front wall 408. It will be noted that the upstands 412 are higher than the front wall 408 and in particular are higher than the slot 410 for mounting the circuit board.

Figure 3:
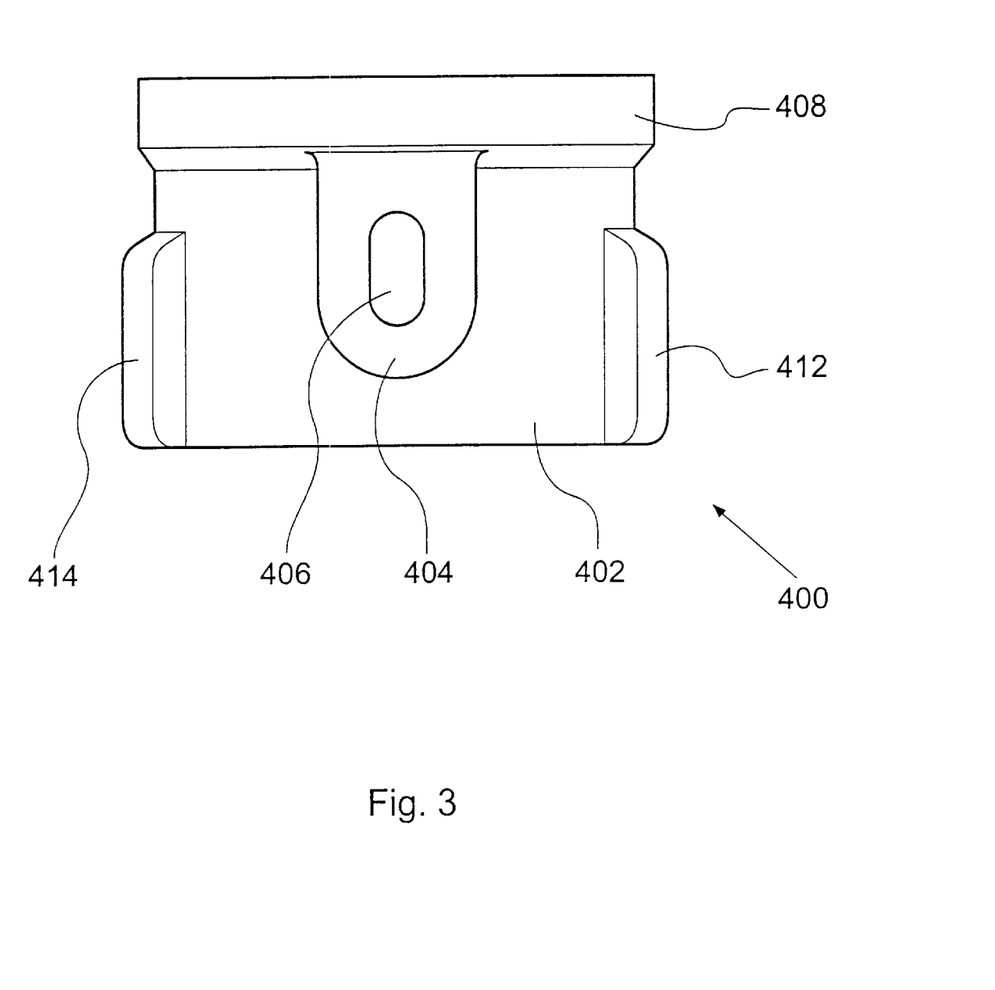
FIG. 3 is a plan view of the circuit board mount of FIG. 2.

FIG. 3 is a plan view of the circuit board mount 400 of FIG. 2. This illustrates the forward upstanding wall 408 at a front edge of the base 402, the through hole 406 in the upstanding boss 404 and the upstands 412 and 414.

Figure 4:
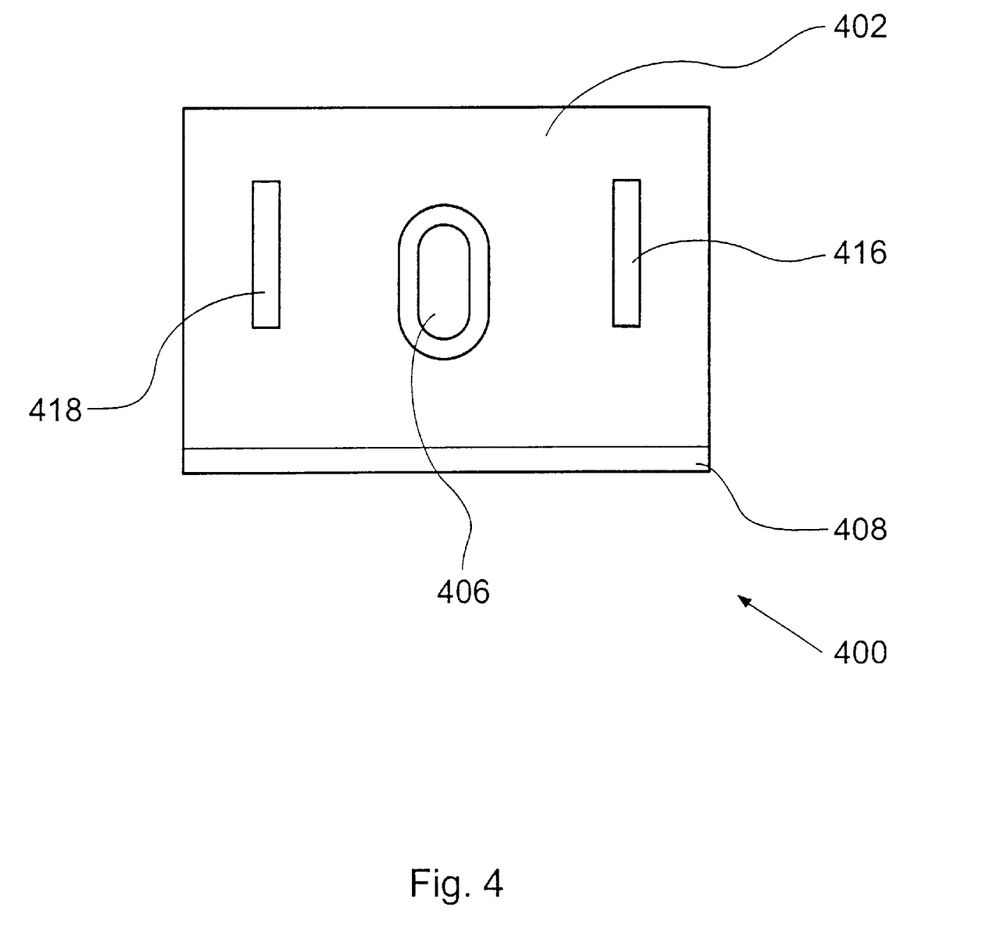
FIG. 4 is a view of the underside of the circuit board mount of FIG. 2.

FIG. 4 is a view of the underside of the circuit board mount 400. This shows the underside of the base 402 and the through hole 406. At the front edge of the base 402, the upstanding wall 408 can be seen. Also shown are linear ridges 416 and 418 that are configured to fit within corresponding linear recesses in a surface of the computer housing on which the circuit board mount is to be mounted. The combination of the elongate hole 406 and the upstands 416 and 418 mean than the circuit board mount can be slideably mounted on the supporting surface within the computer system housing.

Figure 5:
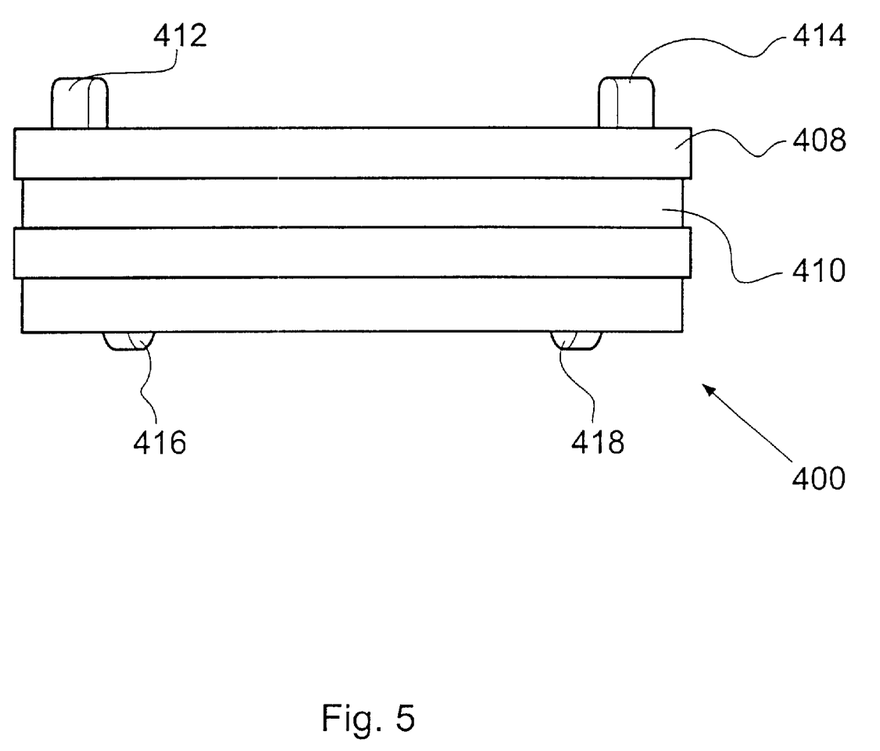
FIG. 5 is a front view of the circuit board mount of FIG. 2.

FIG. 5 is a front view of the circuit board mount 400, illustrating the slot 410 in the forward wall 408, the linear ridges 416 and 418 and the upstanding walls 412 and 414.

Figure 6:
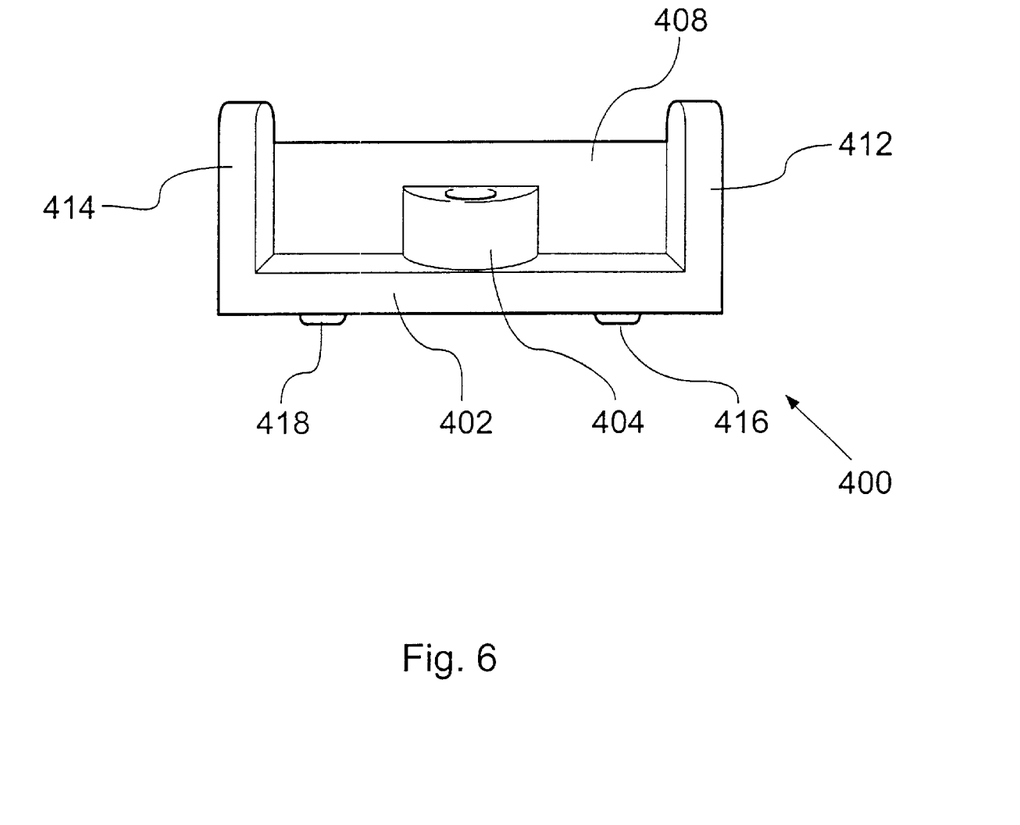
FIG. 6 is a rear view of the circuit board mount of FIG. 2.

FIG. 6 is a rear view of the circuit board mount 400 illustrating the base 402, the upstanding boss 404, the upstanding walls 412 and 414, the front wall 408 and the linear ridges 416 and 418.

Figure 7:
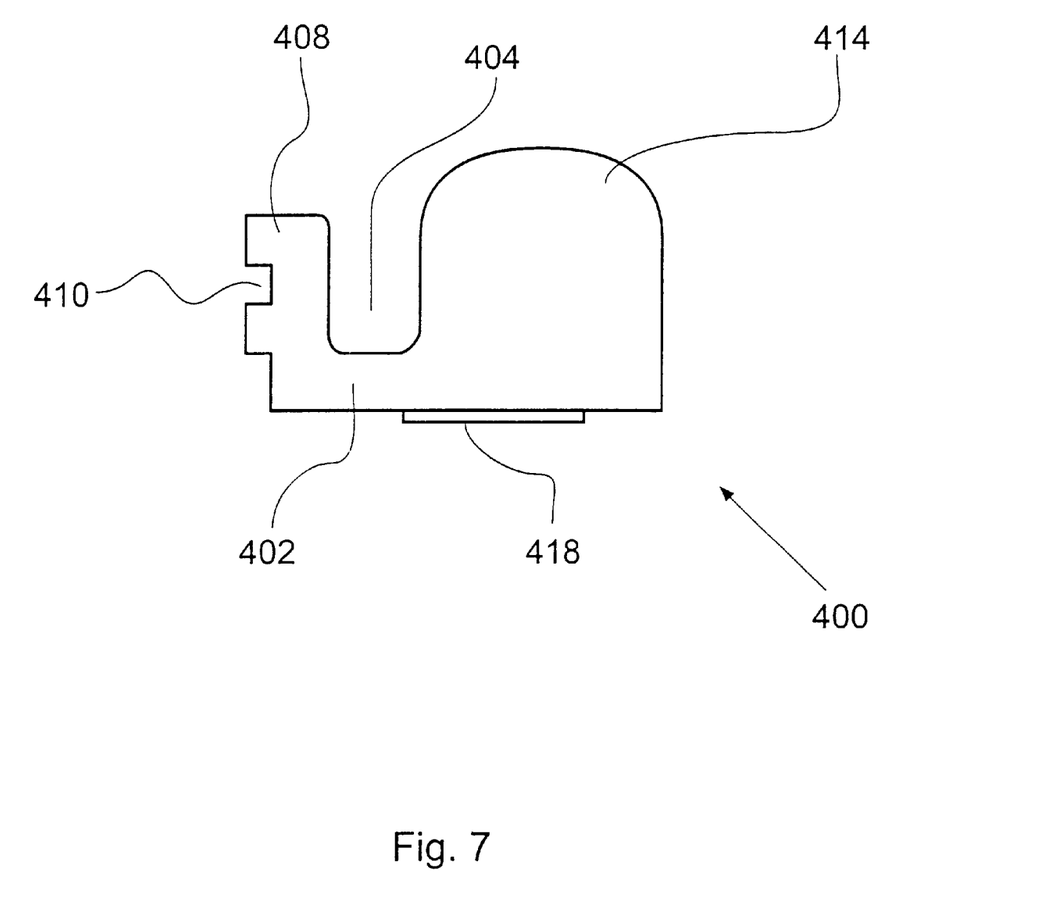
FIG. 7 is a side view of the circuit board mount of FIG. 2.

FIG. 7 is a side view of the circuit board mount 400 showing the front wall 408 with the slot 410, the base 402 with one of the ridges 418 and one of the upstands 414.

Figure 8:
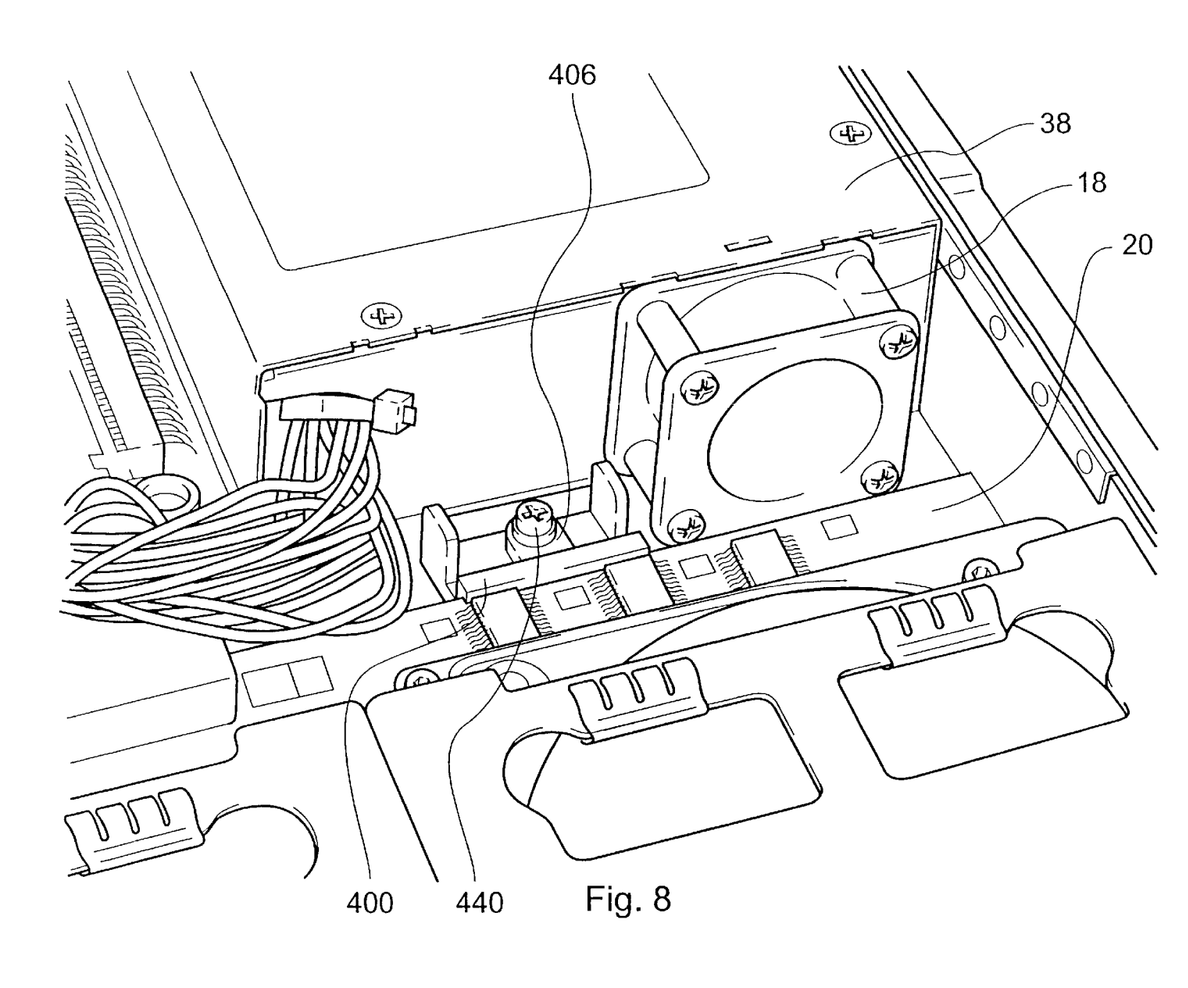
FIG. 8 is a perspective view of the circuit board mount of FIG. 2 in situ in a computer housing supporting a motherboard.

FIG. 8 illustrates the circuit board mount in situ in a computer system housing. This shows the circuit board mount 400 in a final supporting position where the circuit board mount is supporting the circuit board 20. This also shows a power supply 38 with the power supply fan 18 shown in close proximity to the circuit board mount 400.

When installing the circuit board mount 400, the circuit board mount would initially be placed on the supporting surface (eg, the base surface) of the computer system housing and would be loosely secured in place with the screw 440 near the front end of the elongate hole 406. The mount 400 is then slid towards the motherboard 20 so that the horizontal slot 410 engages around the edge of the motherboard 20 and supports the same at a first height above the supporting surface. At this point, the screw is then located at the rearward end of the elongate hole 406, at which point it may be fully tightened to firmly mount the circuit board mount to the supporting surface in the computer system housing. During the sliding movement, the ridges 416 and 418, in cooperation with the corresponding recesses formed in the base of the computer system housing, enable a positive sliding action without the circuit board mount rotating.

It will be appreciated that the linear ridges could be formed, instead, on the supporting surface of the computer system housing, with corresponding linear recesses being formed in the circuit board mount 400.

Figure 9:
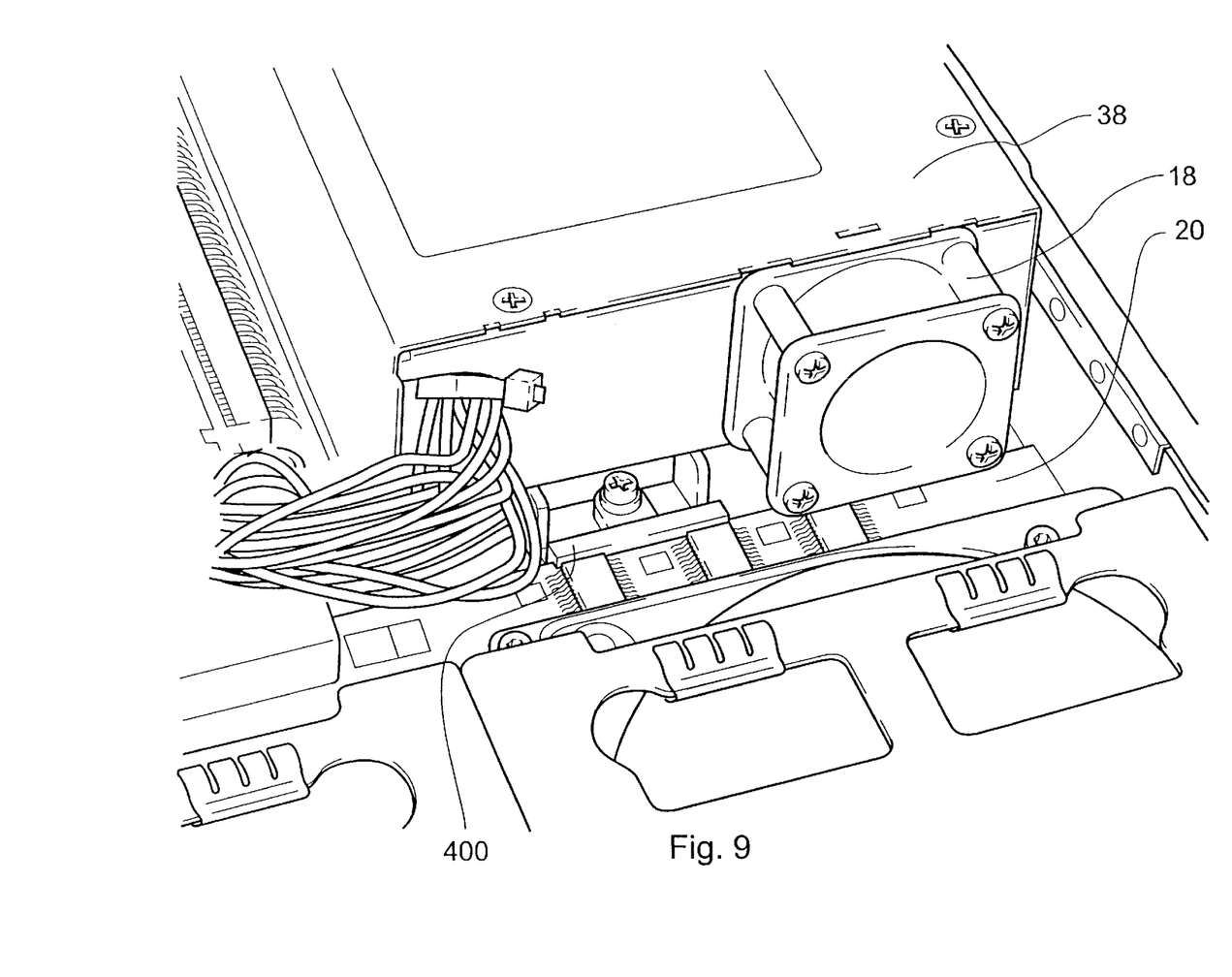
FIG. 9 illustrates the installation of FIG. 8, with a power supply supported on upstands of the circuit board mount of FIG. 2.

FIG. 9 illustrates the purpose of the upstands 412 and 414. It will be appreciated from FIGS. 8 and 9 that there is very little space between the various components in the computer system housing, and in particular a component such as the heavy power supply 38 with its fan 18 could potentially damage the motherboard during insertion or removal of that power supply. As illustrated in FIG. 9, it can be seen that the power supply 38 can be supported by the upstands 412 and 414 at a second height, higher than the first height, with respect to the supporting surface during insertion or removal to avoid potential damage to the motherboard 20 and the components thereon.

During insertion of the power supply 38, at least one end thereof can be rested on the upstands 412 and 414. It can then be slid backwards and lowered down behind the circuit board mount 400 to its final resting place at a third height with respect to the supporting surface that is lower than the first height (i.e. lower than the motherboard and/or the top of the circuit elements mounted thereon). In the example shown, the base of the power supply 38 rests on the supporting surface of the housing, whereby the third height corresponds to the housing surface.

During removal of the power supply 38, the reverse order of operations is employed.

Accordingly, it can be seen that a circuit board mount 400 as described can be used to ensure that a component, particularly a bulky or heavy component such as the power supply 38, can be inserted and removed in a tight space beside a circuit board (e.g., the motherboard 20) without damaging the circuit board and/or circuit elements on that circuit board.

Thus, there has been described a circuit board mount for mounting a circuit board in an electronic equipment housing. The mount is mountable on a surface within the housing and includes a slot for receiving and supporting the circuit board at a first height with respect to the housing surface. The mount further comprises at least one upstand of a second height higher than that of the circuit board, whereby a component can be supported on the upstand without contacting the circuit board. The mount is thus able to support the circuit board and to protect the circuit board during handling of other components within the housing.

Although a particular embodiment of the invention has been described, it will be appreciated that the invention is not limited thereto and that many modifications, including additions, deletions and substitutions may be made within the spirit and scope of the claimed invention.

What is claimed is:

1. A circuit board mount for mounting a circuit board in an electronic equipment housing, the mount being slideably on a housing surface within the housing and including a slot configured to be slideably engagable with the circuit board on sliding the mount with respect to the housing surface and to support the circuit board at a first height with respect to the housing surface, the mount further comprising at least one upstand of a second height higher than the first height, whereby a component is supportable on the upstand without contacting the circuit board.

2. The circuit board mount of claim 1, wherein the mount has a slot-shaped aperture for receiving a fastening such that the mount is slideably mountable on the housing surface.

3. The circuit board mount of claim 1, wherein a lower surface of the mount has at least one linear ridge for engagement with a linear depression in the housing surface to facilitate linear sliding of the mount with respect to the housing surface.

4. The circuit board mount of claim 1, comprising two upstands, one either side of the mount.

5. The circuit board mount of claim 1, the circuit board mount being formed from plastics material.

6. Electronic equipment comprising a housing, a circuit board and a circuit board mount, which circuit board mount is slideably mounted on a housing surface within the housing and includes a slot configured to be slideably engagable with the circuit board on sliding the mount with respect to the housing surface and to support the circuit board at a first height with respect to the housing surface, the mount further comprising at least one upstand of a second height higher than the first height, whereby a component is supportable on the upstand without contacting the circuit board.

7. The electronic equipment of claim 6, wherein the mount has a slot-shaped aperture for receiving a fastening such that the mount is slideably mountable on the housing surface.

8. The electronic equipment of claim 6, wherein a lower surface of the mount has at least one linear ridge for engagement with a linear depression in the housing surface to facilitate linear sliding of the mount with respect to the housing surface.

9. The electronic equipment of claim 6, wherein the mount comprises two upstands, one either side of the mount.

10. The electronic equipment of claim 6, wherein the circuit board mount is formed from plastics material.

11. The electronic equipment of claim 6, wherein the circuit board is a motherboard.

12. The electronic equipment of claim 6, further comprising a component that can be supported on the upstand during introduction or removal of the component from the housing.

13. The electronic equipment of claim 12, wherein the component is a power supply.

14. The electronic equipment of claim 6, wherein the electronic equipment is a computer server.

15. Electronic equipment comprising a housing, a circuit board and a circuit board mount, which circuit board mount is mounted on a surface within the housing and includes a slot operable to receive the circuit board and to support the circuit board at a first height with respect to the housing surface, the mount further comprising at least one upstand of a second height higher than the first height, whereby a component is supportable on the upstand without contacting the circuit board; and a component that can be supported on the upstand during introduction or removal of the component from the housing, wherein the component is located beside the mount and the circuit board when the component is fully received in the housing, a base of the component being at a height lower than the first height with respect to the housing surface.

16. Electronic equipment comprising a housing, a circuit board and a circuit board mount, which circuit board mount is mounted on a surface within the housing and includes a slot operable to receive the circuit board and to support the circuit board at a first height with respect to the housing surface, the mount further comprising at least one upstand of a second height higher than the first height, whereby a component is supportable on the upstand without contacting the circuit board; and a component that can be supported on the upstand during introduction or removal of the component from the housing, wherein the component is located beside the mount and the circuit board when the component is fully received in the housing, a base of the component being at a third height lower than said first height with respect to the housing surface.

17. The electronic equipment of claim 16, wherein the base of the component rests on the housing surface, whereby the third height corresponds to the housing surface.

18. A circuit board mount for mounting a circuit board in an electronic equipment housing, the mount being mountable on a surface within the housing and including a slot means configured to be slideably engagable with the circuit board and for supporting the circuit board at a first height with respect to the housing surface, the mount further comprising at least one upstanding means of a second height higher than the first height, whereby a component can be supported on the upstanding means without contacting the circuit board.

19. A method of supporting a circuit board in an electronic equipment housing, the method comprising slideably mounting a circuit board mount on a housing surface within the housing, the mount being slideable towards the circuit board and including a slot configured to be slideably engagable with the circuit board on sliding the mount with respect to the housing surface and for supporting the circuit board at a first height with respect to the housing surface, securing the mount with the circuit board received in the slot, and subsequently using at least one upstand of the mount of a second height higher than that of the circuit board to support a component during insertion or removal of the component without the component contacting the circuit board.

20. The method of claim 19, wherein the component is located beside the mount and the circuit board when the component is fully received in the housing, a base of the component being at a third height lower than the first height with respect to the housing surface.

21. The method of claim 19, wherein the base of the component rests on the housing surface, whereby the third height corresponds to the housing surface.

22. The method of claim 20, wherein the base of the component rests on the housing surface, whereby the third height corresponds to the housing surface.

* * * * *

UNITED STATES PATENT AND TRADEMARK OFFICE
CERTIFICATE OF CORRECTION

PATENT NO.   : 6,693,799 B2
DATED        : February 17, 2004
INVENTOR(S)  : Gough et al.

It is certified that error appears in the above-identified patent and that said Letters Patent is hereby corrected as shown below:

Column 4,
Line 67, please insert -- mountable -- after "slideably".

Signed and Sealed this

Twenty-ninth Day of June, 2004

JON W. DUDAS
*Acting Director of the United States Patent and Trademark Office*